United States Patent
Kim et al.

(10) Patent No.: US 6,723,644 B2
(45) Date of Patent: Apr. 20, 2004

(54) METHOD OF FABRICATING A SEMICONDUCTOR DEVICE USING TWO CHEMICAL MECHANICAL POLISHING PROCESSES TO POLISH REGIONS HAVING DIFFERENT CONDUCTIVE PATTERN DENSITIES

(75) Inventors: Jung-yup Kim, Seoul (KR); Sang-rok Hah, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/094,994

(22) Filed: Mar. 12, 2002

(65) Prior Publication Data

US 2002/0132492 A1 Sep. 19, 2002

(30) Foreign Application Priority Data

Mar. 14, 2001 (KR) ........................... 2001-13192

(51) Int. Cl.⁷ ............................... H01L 21/31
(52) U.S. Cl. .................... 438/691; 438/745; 438/749; 438/759
(58) Field of Search ................. 438/691, 692, 438/693, 745, 7, 9, 750, 756, 753, 759, 761, 763

(56) References Cited

U.S. PATENT DOCUMENTS 6,069,081 A * 5/2000 Kelleher et al. ............ 438/692
6,245,642 B1 * 6/2001 Satoh ......................... 438/427

* cited by examiner

*Primary Examiner*—Wael M. Fahmy
*Assistant Examiner*—Ginette Peralta
(74) *Attorney, Agent, or Firm*—Volentine Francos, PLLC

(57) ABSTRACT

A method of manufacturing a semiconductor device is capable of preventing a dishing phenomenon from occurring without using dummy patterns. A plurality of conductive patterns are formed along the entire surface of a semiconductor substrate with an irregular pattern density. The conductive patterns have a first stopper layer at the top thereof. An interlayer insulating layer is formed on the conductive patterns. Next, a second stopper layer is formed on the interlayer insulating layer. An etching mask is formed on the second stopper layer so as to expose a first region having a conductive pattern density that is higher than that of another region(s). By using the etching mask, the second stopper layer and part of the interlayer insulating layer are etched at the first region. The resultant structure is then first polished to expose the first stopper layer at the first region, by using a slurry that provides a polishing rate for the interlayer insulating layer that is higher than that for either the first and second stopper layers. The resultant structure is then polished for a second time to remove the second stopper layer form the region(s) of lower pattern density, by using a slurry that provides a polishing rate that is higher for the second stopper layer than for either the first stopper layer and the interlayer insulating layer.

13 Claims, 4 Drawing Sheets

METHOD OF FABRICATING A SEMICONDUCTOR DEVICE USING TWO CHEMICAL MECHANICAL POLISHING PROCESSES TO POLISH REGIONS HAVING DIFFERENT CONDUCTIVE PATTERN DENSITIES

BACKGROUND OF THE INVENTION

1. Field of the Invention

The present invention relates to a method of fabricating a semiconductor device. More particularly, the present invention relates to the process of planarizing a surface on a semiconductor substrate in the fabricating of a semiconductor device.

2. Description of the Related Art

A semiconductor integrated circuit chip is a micro electronic device made up of various semiconductor devices integrated on a semiconductor substrate. As semiconductor devices become more highly integrated and more compact, and as the number of wiring layers of the semiconductor devices increase, step differences at the various surfaces on the substrate increase. A variety of techniques for planarizing these surfaces to eliminate the step differences have been developed. These planarizing techniques include silicon-on-glass (SOG), etch-back, reflow, and chemical mechanical polishing (CMP) techniques.

In particular, CMP is one of many very large scale integrated (VLSI) processing techniques and is considered to be a core technique for achieving high degrees of integration in semiconductor devices. Specifically, CMP is a global planarization technique for chemically and mechanically planarizing a surface to remove irregularities at the surface. In CMP, a polishing pad is pressed against a wafer surface on which particular material layers are formed, a polishing liquid, such as a slurry, is fed between the wafer surface and the polishing pad, and the polishing pad and the wafer are rotated in opposite directions.

The density of patterns formed on a wafer can considerably affect the subsequent deposition of layers and the CMP performed on deposited layers. FIGS. 1 and 2 are cross-sectional views illustrating the effects of the density of patterns on subsequent processes.

Referring to FIG. 1, a plurality of conductive patterns, which consist of a conductive layer 12 and a first stopper layer 14, are formed on a semiconductor substrate 10. Note, FIG. 1 illustrates only part of a semiconductor wafer. In FIG. 1, the region marked "A" is a cell region and the region marked "B" is a peripheral region. As shown in FIG. 1, complex semiconductor devices are formed in the cell region A, whereby the density of patterns in the cell region A is very high. On the other hand, alignment key patterns or some resistant layers are formed in the peripheral region B and thus, the density of patterns in the peripheral region B is low.

An interlayer insulating layer 16 for forming a multi-layered structure is deposited on the resultant substrate 10. The interlayer insulating layer 16 is thicker at the cell region A, which has a higher pattern density, than at the peripheral region B, which has a lower pattern density.

FIG. 2 shows dishing occurring after CMP is performed on the interlayer insulating layer 16. Because CMP is a global planarization technique, a predetermined thickness of the interlayer insulating layer 16 is removed along the entire wafer until the first stopper layer 14 in the peripheral region B is exposed. In this case, the entire surface of the interlayer insulating layer 16 does not become entirely flat, i.e., dishing occurs at the peripheral region B. If the CMP were performed further, the first stopper layer 14 would become too thin or the conductive layer 12 under the first stopper layer 14 would be exposed. In FIG. 2, the step difference between the cell region A and the peripheral region B is exaggerated so that the dishing that occurs in the prior art can seen more easily.

As described above, the peripheral region B is chemically and mechanically polished more than the cell region A. The reasons for this are as follows. First, the surface height of the interlayer insulating layer 16 becomes greater at the cell region A than at the peripheral region B as a result of the deposition process, because the cell region A has a greater pattern density than the peripheral region B. Secondly, even though a particular amount of slurry is fed between the semiconductor substrate 10 and the polishing pad (not shown), more slurry feeds to the peripheral region B than to the cell region A due to the difference in pattern density between the cell region A and the peripheral region B.

Dishing may cause the conductive layer 12 to be damaged by a subsequent cleaning process. In addition, in a case in which another conductive layer is subsequently formed on the interlayer insulating layer 16, such a conductive layer may be short-circuited at the peripheral region B.

FIG. 3 shows a fabrication technique of the prior art for solving the above-described dishing problem. Referring to FIG. 3, dummy patterns are formed in the peripheral region B to increase the pattern density of the peripheral region B. As a result, the height of the interlayer insulating layer 16 is relatively uniform along the entire. Thus, the entire surface on the substrate 10 will become flat when CMP is performed.

However, some semiconductor integrated circuit designs make it impossible to form dummy patterns in a region intended to have a lower pattern density. For instance, it may be impractical to use dummy patterns in consideration of the characteristics of processes subsequent to the formation of the interlayer insulating layer 16 or the characteristics of the semiconductor device to be formed. In addition, unexpected parasitic capacitance may occur between the conductive layers of each of the dummy patterns, thereby creating operation failures in the semiconductor device.

SUMMARY OF THE INVENTION

It is thus an object of the present invention to overcome the above-described problems of the prior art.

More specifically, it is a first object of the present invention to provide a method of manufacturing a semiconductor device that is capable of preventing a dishing phenomenon from occurring as the result of chemical mechanical polishing, and which method does not involve the use of dummy patterns.

It is a second object of the present invention to provide a method of manufacturing a semiconductor device in which chemical mechanical polishing is effectively carried out on regions of the same semiconductor substrate having significantly different pattern densities.

To achieve these objects, the method of manufacturing a semiconductor device according to the present invention uses a second stopper layer formed on the interlayer insulating layer, and two polishing processes. An etching mask is formed on the second stopper layer so as to discriminate a first region having a high conductive pattern density from a region(s) having a low pattern density. Using the etching mask, the second stopper layer and part of the interlayer insulating layer are etched at the first region. Next, a first polishing process is performed, using a slurry providing a polishing rate that is higher for the interlayer insulating layer than for either the first and second stopper layers, to expose the surface of the first stopper layer. Finally, a second polishing process is performed, using a slurry providing a polishing rate that is higher for the second stopper layer than for either the first stopper layer and the interlayer insulating layer, to remove the second stopper layer from the region(s) having the lower pattern density.

The present invention is particularly applicable to a semiconductor substrate divided into a cell region having a high conductive pattern density and a peripheral region having a low conductive pattern density.

Preferably, the first stopper layer is a silicon nitride layer, the interlayer insulating layer is an oxide layer, and the second stopper layer is a polysilicon layer.

Preferably, the first polishing process polishes the interlayer insulating layer at rate that is 4–500 times greater than that at which either of the first and second stopper layers is polished. Similarly, the second polishing process preferably polishes the polysilicon layer at a rate that is 4–500 times greater than that at which either the first stopper layer and the interlayer insulating layer are polished.

According to the present invention, without the use of dummy patterns it is nonetheless possible to prevent the chemical mechanical polishing process, i.e., the slurry, from creating a dishing phenomenon at the region(s) of lower pattern density.

BRIEF DESCRIPTION OF THE DRAWINGS

The above and other objects, features and advantages of the present invention will become more apparent from the following detailed description of the preferred embodiment thereof made with reference to the attached drawings, of which:

FIGS. 3 through 7 are cross-sectional views of a substrate, illustrating the progression of a method of manufacturing a semiconductor device according to the present invention.

DETAILED DESCRIPTION OF THE INVENTION

Figure 1:
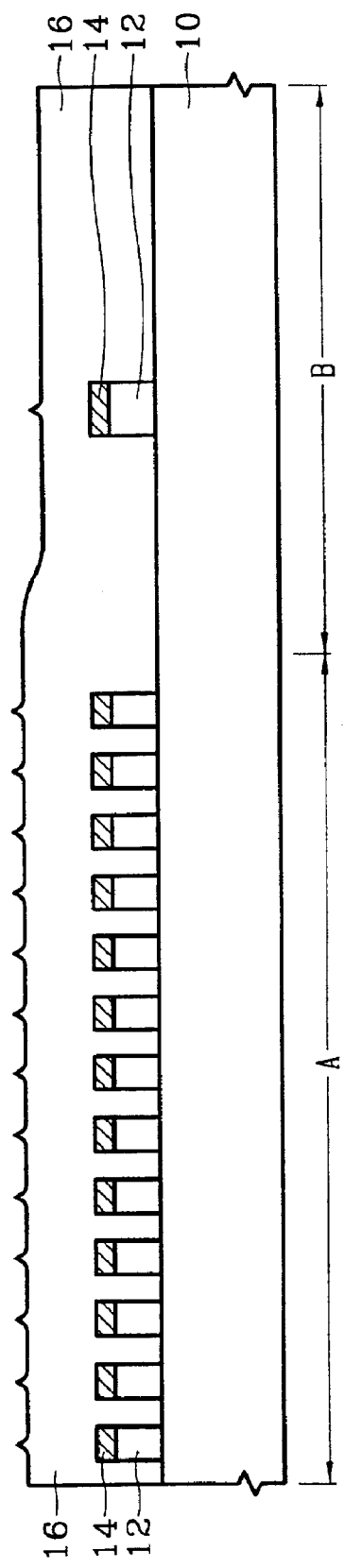
FIGS. 1 and 2 are cross-sectional views of a substrate during the manufacture of a semiconductor device according to the prior art.
Figure 2:
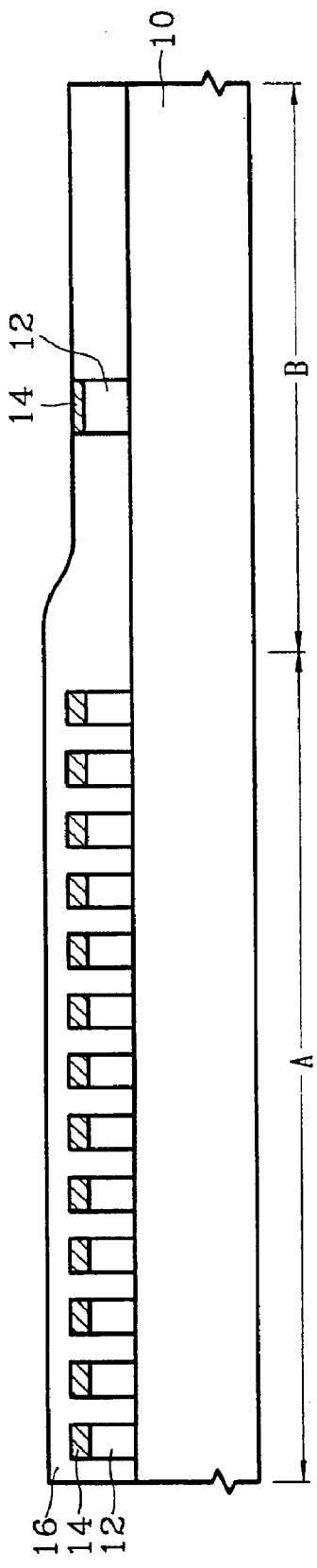
Figure 3:
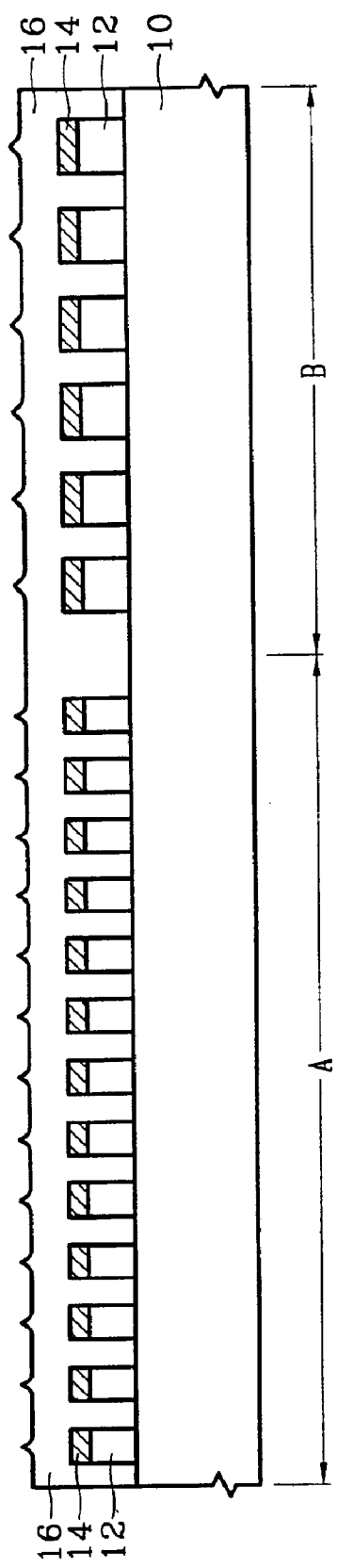
FIG. 3 is a cross-sectional view of a substrate during the manufacture of a semiconductor device, illustrating a prior art technique for solving problems created when using the method shown in FIG. 2.

The present invention will now be described more fully with reference to the accompanying drawings. In the drawings, the thickness of layers and regions are exaggerated for clarity. It will also be understood that when a layer is referred to as being "on" another layer or substrate, the layer in question can be directly on the other layer or substrate, or intervening layers may be present therebetween.

Figure 4:
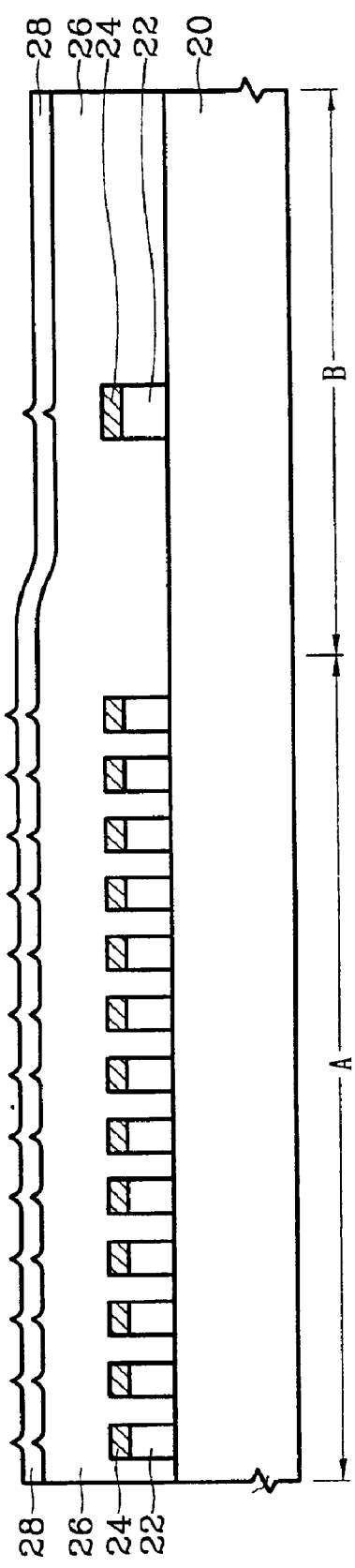

Referring now to FIG. 4, a plurality of conductive patterns are formed on a semiconductor substrate 20. Specifically, a conductive layer 22 and a first stopper layer 24 are formed on the semiconductor substrate 20 by performing the same processes used in the method shown in FIG. 1. The first stopper layer 24 is formed of a nitride layer, such as a silicon nitride layer. The first stopper layer 24 and the conductive layer 22 are sequentially etched by typical photolithography, thereby forming a plurality of conductive patterns, each of which comprises a part of the conductive layer 22 and the first stopper layer covering the conductive layer 22.

The semiconductor substrate 20 shown in FIG. 4 constitutes part of a semiconductor wafer. The region marked "A" is a cell region, and the region marked "B" is a peripheral region. As illustrated in FIG. 4, complex semiconductor devices are formed in the cell region A, and the pattern density of the cell region A is very high. On the other hand, alignment key patterns and some resistant layers are formed in the peripheral region B, and the pattern density of the peripheral region B is very low.

Note, various underlying layers may be interposed between the semiconductor substrate 20 and the conductive layer 22. Furthermore, even though the semiconductor substrate 20 and the conductive layer 22 are illustrated as being separate layers, the semiconductor substrate 20 and the conductive layer 22 may be formed of the same material layer. In the present embodiment, the conductive layer 22 is formed on a silicon semiconductor substrate 20. Only this case in which the conductive layer 22 is directly formed on the semiconductor substrate 20 will be described for the purpose of explaining the present invention.

In any case, an interlayer insulating layer 26 is then formed over the entire surface the semiconductor substrate 20, i.e., over both the cell region A and the peripheral region B in which the conductive patterns have been formed at significantly different pattern densities. The interlayer insulating layer 26 is an oxide layer, such as a silicon oxide layer. At this time, the height of the interlayer insulating layer 26 at the cell region A is greater than that at the peripheral region B due to the difference in the pattern densities. Next, a second stopper layer 28 is formed on the interlayer insulating layer 26. The second stopper layer 28 is formed of polysilicon to a thickness of 100–1000 Å. As shown in FIG. 4, the interlayer insulating layer 26 and the second stopper layer 28 protrude above the conductive patterns.

Figure 5:
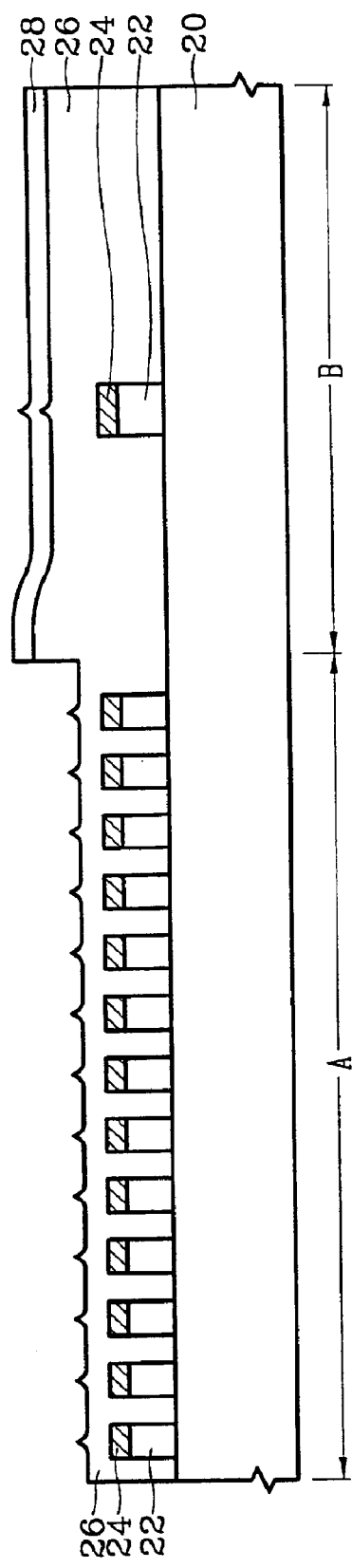

Referring to FIG. 5, a photoresist layer is formed on the second stopper layer 28, and an etching mask is formed from the photoresist layer by conventional photolithography. Then, the second stopper layer 28 and the interlayer insulating layer 26 are sequentially etched anisotropically leaving an interlayer insulating layer 26 having only a thickness of about 1000 Å on the conductive patterns of the cell region A.

Figure 6:
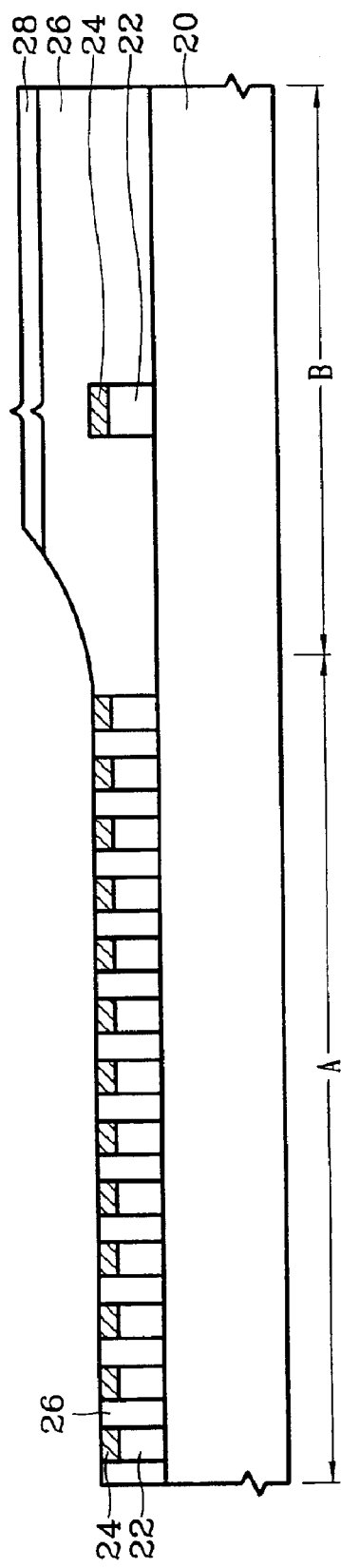

Next, referring to FIG. 6, a first CMP process is carried out according to the present invention. In this first polishing step, the interlayer insulating layer 26 remaining on the conductive patterns of the cell region A is removed, and the part of the second stopper layer 28 at the boundary between the cell region A and the peripheral region B is polished. Also, a slurry that is characterized as being capable of providing a silicon nitride:polysilicon:silicon oxide polishing selection ratio of 1:1:5 to 1:1:400 is preferably used. In a preferred embodiment, ceria (abrasive model number: HS-8005, chemical model number: HS-8102GP) manufactured by Hitachi Ltd., was used as a slurry to provide a silicon nitride:polysilicon:silicon oxide polishing selection ratio of 1:2:50.

Figure 7:
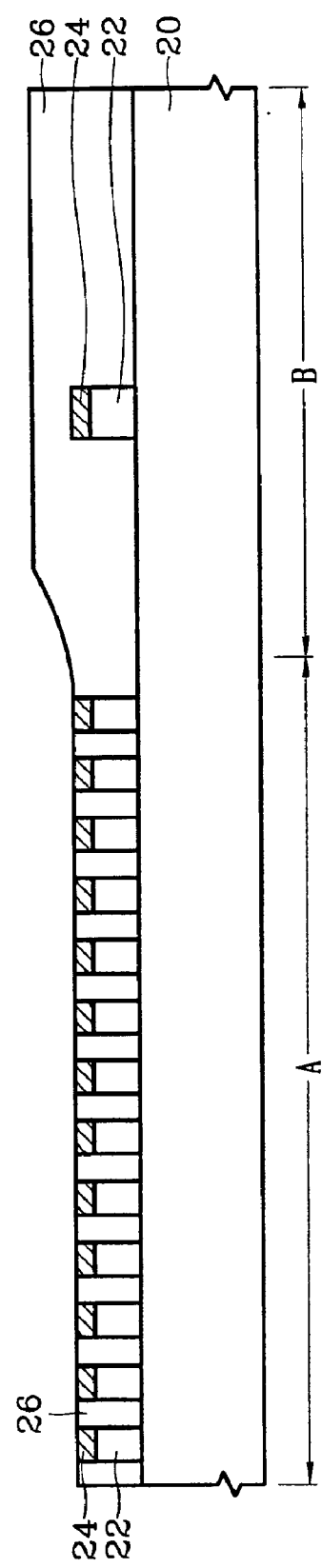

Referring to FIG. 7, a second CMP process is carried out according to the present invention. In this second polishing step, the second stopper layer 28 at the peripheral region B is removed. Also, a slurry that is characterized as being capable of providing a silicon nitride:polysilicon:silicon oxide polishing selection ratio of 1:5:1 to 1:400:1 is preferably used. In a preferred embodiment, a mixture of a slurry (model number: P-6103) manufactured by Fujimi Ltd. and ultra pure water was used wherein the ratio of slurry to water was 1:3. As shown in FIG. 7, dishing does not occur in the peripheral region B due to the existence of the second stopper layer 28 even though the peripheral region B has a lower pattern density.

Thus, according to the present invention as described above, dummy patterns are not required. That is, in a case wherein patterns are formed at different densities on a semiconductor substrate, dishing does not occur, as a result of CMP, in a region exhibiting a lower pattern density.

Accordingly, even when dummy patterns cannot possibly be formed on a semiconductor substrate due to either the characteristics of processes that are to be carried out after the formation of an interlayer insulating layer or due to characteristics of the semiconductor device to be formed, the present invention allows for CMP to be performed without creating a problematic dishing phenomenon. In addition, this obviates the problem of parasitic capacitance that may otherwise occur between the conductive layers of a dummy pattern. Hence, semiconductor devices manufactured by the method of the present invention operate more reliably.

Although the present invention has been described by way of the preferred embodiments thereof, the invention may, however, be embodied in many was. For instance, as described above, in the present embodiment, the region having a higher pattern density is a cell region A, whereas the region having a lower pattern density is a peripheral region B, i.e., a region outside the region A. However, the present invention is not limited to the regions of different pattern densities being the cell region A and a peripheral region B. Rather, the present invention may also be applied to manufacturing a semiconductor device wherein the regions of different pattern densities are present in the same cell region. In addition, the first and second stopper layers 24 and 28 have been disclosed as a silicon nitride layer and a polysilicon layer, respectively, and the interlayer insulating layer 26 has been disclosed as a silicon oxide layer. However, the present invention may be applied to the manufacturing of devices having other materials for these layers. Therefore, although the present invention has been shown and described with reference to the preferred embodiments thereof, various changes in form and details, as will become apparent to those of ordinary skill in the art, may be made thereto without departing from the true spirit and scope of the invention as defined by the appended claims.

What is claimed is:

1. A method of manufacturing a semiconductor device comprising:
   forming a plurality of conductive patterns at densities that differ, in first and second regions, along a surface of a semiconductor substrate, the density of the conductive patterns in the first region being greater than the density of the conductive patterns in the second region, and the conductive patterns comprising a first stopper layer at the top thereof, whereby trenches are formed between adjacent ones of all of the conductive patterns, the tops of the trenches thus being located at the same level as an upper surface of said first stopper layer;
   overfilling the trenches and forming an interlayer insulating layer on the conductive patterns wherein the interlayer insulating layer has a greater thickness at said first region than at said second region such that a step is defined in said interlayer insulating layer;
   forming a second stopper layer on the interlayer insulating layer;
   forming an etching mask on the second stopper layer that exposes and covers the first and second regions in which the conductive patterns are present;
   using the etching mask to etch the second stopper layer and the interlayer insulating layer at said first region, while leaving the second stopper layer and the interlayer insulating layer at said second region where the density of the conductive patterns is lower;
   performing a first polishing of the resultant structure using a slurry having a polishing rate that is higher for the interlayer insulating layer than for the first and second stopper layers so as to expose the surface of the first stopper layer at said first region; and
   performing a second polishing of the resultant structure using a slurry having a polishing rate that is higher for the second stopper layer than for the first stopper layer and the interlayer insulating layer so as to remove the second stopper layer from said second region.

2. The method of manufacturing a semiconductor device of claim 1, wherein said forming of a plurality of conductive patterns comprises forming a cell region and a peripheral region of conductive patterns, the cell region constituting said first region, and the peripheral region bordering the cell region and constituting said second region having a lower density of the conductive patterns than the cell region.

3. The method of manufacturing a semiconductor device of claim 1, wherein said forming of the conductive patterns comprises forming the first stopper layer of silicon nitride, said forming of the interlayer insulating layer comprises forming an oxide layer on the conductive patterns, and said forming of the second stopper layer comprises forming a polysilicon layer on the oxide layer.

4. The method of manufacturing a semiconductor device of claim 3, wherein the etching of the second stopper layer and the interlayer insulating layer is terminated once the interlayer insulating layer has a thickness of at least 1000 Å above the first stopper layer at said first region.

5. The method of manufacturing a semiconductor device of claim 3, wherein said forming of the polysilicon layer comprises forming a polysilicon layer having a thickness of 100–1000 Å on the oxide layer.

6. The method of manufacturing a semiconductor device of claim 3, wherein said first polishing comprises using a slurry providing a polishing rate that is 5–400 times greater for the interlayer insulating layer than for either of the stopper layers.

7. The method of manufacturing a semiconductor device of claim 3, wherein said second polishing comprises using a slurry providing a polishing rate that is 5–400 times greater for the polysilicon layer than for either the first stopper layer and the interlayer insulating layer.

8. A method of manufacturing a semiconductor device comprising:
   sequentially forming a conductive layer and a first stopper layer on a substrate including at a cell region and a peripheral region bordering the cell region;
   forming an interlayer insulating layer on the entire surface of the first stopper layer;
   forming a second stopper layer on the interlayer insulating layer;
   forming an etching mask on the second stopper layer and which mask exposes the cell region;
   using the etching mask to etch the second stopper layer and a part of the interlayer insulating layer at the cell region;
   performing a first polishing of the resultant structure using a slurry providing a polishing rate that is higher for the interlayer insulating layer than for either the first and second stopper layers, to expose the surface of the first stopper layer at said cell region; and performing a second polishing of the resultant structure using a slurry providing a polishing rate that is higher for the second stopper layer than for either the first stopper layer and the interlayer insulating layer, to remove the second stopper layer at the peripheral region.

9. The method of manufacturing a semiconductor device of claim 8, wherein said forming of the first stopper layer comprises forming a layer of silicon nitride on the conductive layer, said forming of the interlayer insulating layer comprises forming an oxide layer on the first stopper layer, and said forming of the second stopper layer comprises forming a polysilicon layer on the oxide layer.

10. The method of manufacturing a semiconductor device of claim 9, wherein the etching of the second stopper layer and the interlayer insulating layer is terminated once the interlayer insulating layer has a thickness of at least 1000 Å above the first stopper layer at said first region.

11. The method of manufacturing a semiconductor device of claim 9, wherein said forming of the polysilicon layer comprises forming a polysilicon layer having a thickness of 100–1000 Å on the oxide layer.

12. The method of manufacturing a semiconductor device of claim 9, wherein said first polishing comprises using a slurry providing a polishing rate that is 5–400 times greater for the interlayer insulating layer than for either of the stopper layers.

13. The method of manufacturing a semiconductor device of claim 9, wherein said second polishing comprises using a slurry providing a polishing rate that is 5–400 times greater for the polysilicon layer than for either the first stopper layer and the interlayer insulating layer.

* * * * *